United States Patent
Mohaupt et al.

(10) Patent No.: US 10,295,269 B2
(45) Date of Patent: May 21, 2019

(54) FLAT HEAT PIPE WITH RESERVOIR FUNCTION

(71) Applicant: EURO HEAT PIPES, Nivelles (BE)

(72) Inventors: Mikael Mohaupt, Feluy (BE); Stéphane Van Oost, Rosieres (BE)

(73) Assignee: EURO HEAT PIPES, Nivelles (BE)

( * ) Notice: Subject to any disclaimer, the term of this patent is extended or adjusted under 35 U.S.C. 154(b) by 71 days.

(21) Appl. No.: 15/518,707

(22) PCT Filed: Oct. 12, 2015

(86) PCT No.: PCT/EP2015/073505
§ 371 (c)(1),
(2) Date: Apr. 12, 2017

(87) PCT Pub. No.: WO2016/058966
PCT Pub. Date: Apr. 21, 2016

(65) Prior Publication Data
US 2017/0227296 A1    Aug. 10, 2017

(30) Foreign Application Priority Data
Oct. 15, 2014 (FR) .................................... 14 59885

(51) Int. Cl.
*F28F 1/00* (2006.01)
*H05K 7/20* (2006.01)
(Continued)

(52) U.S. Cl.
CPC ....... *F28D 15/0233* (2013.01); *F28D 15/046* (2013.01); *F28D 15/06* (2013.01);
(Continued)

(58) Field of Classification Search
CPC .... F28D 15/0233; F28D 15/046; F28D 15/04; F28D 15/043; F28D 2015/0216; F28D 15/02; F28D 15/0266; F28D 20/0034; F28F 21/04; H01L 23/427; H05K 7/20336
USPC ......... 165/104.26, 104.21, 104.19, 272, 273, 165/274
See application file for complete search history.

(56) References Cited

U.S. PATENT DOCUMENTS 3,613,778 A   10/1971  Feldman, Jr.
4,833,567 A * 5/1989   Saaski ................ F28D 15/0233
                                                   165/104.26
(Continued)

FOREIGN PATENT DOCUMENTS

DE       202005008792 U1    8/2005

*Primary Examiner* — Justin M Jonaitis
(74) *Attorney, Agent, or Firm* — Seed IP Law Group LLP

(57) ABSTRACT

A flat heat pipe with a two-phase liquid-vapor working fluid, includes a first plate receiving thermal energy from a heat source, a second plate transferring thermal energy to a cold source, an edge to form a hermetically sealed enclosed internal space, a capillary structure interposed between the first and second plates, vaporization channels adjacent to the first plate, condensation channels adjacent to the second plate, a transfer passage placing the evaporation channels in communication with the condensation channels for the transport of vapor, and a collection channel forming a reservoir, in fluid communication with each condensation channel. The collection channel is adjacent to the second plate, such that the collection channel can pump and store the excess liquid phase.

14 Claims, 3 Drawing Sheets

Figure 1:
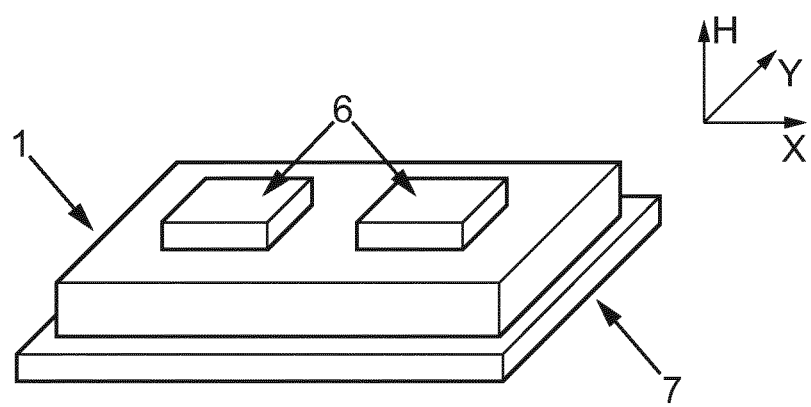

(51) Int. Cl.
*F28D 15/02* (2006.01)
*F28D 15/04* (2006.01)
*F28D 15/06* (2006.01)
*F28F 21/04* (2006.01)
*H01L 23/427* (2006.01)

(52) U.S. Cl.
CPC .............. *F28F 1/006* (2013.01); *F28F 21/04* (2013.01); *H01L 23/427* (2013.01); *H05K 7/20336* (2013.01); *F28F 2210/00* (2013.01); *F28F 2225/02* (2013.01); *F28F 2225/04* (2013.01); *F28F 2265/00* (2013.01); *H01L 2924/0002* (2013.01)

(56) References Cited

U.S. PATENT DOCUMENTS

| | | | | |
|---|---|---|---|---|
| 5,642,776 A * | 7/1997 | Meyer, IV | ......... | F28D 15/0233 165/104.26 |
| 6,082,443 A * | 7/2000 | Yamamoto | ........... | F28D 15/0233 165/104.21 |
| 6,695,040 B1 * | 2/2004 | Kung | .................. | F28D 15/0233 165/104.21 |
| 7,184,265 B2 * | 2/2007 | Kim | .................... | F28D 15/0233 165/104.33 |
| 7,392,836 B2 * | 7/2008 | Wong | ................. | F28D 15/0233 165/104.26 |
| 9,423,192 B2 * | 8/2016 | Tsoi | ..................... | F28D 15/0233 |
| 10,018,427 B2 * | 7/2018 | Lin | ......................... | F28D 15/04 |
| 10,036,597 B2 * | 7/2018 | De Troz | ............... | F28D 15/0266 |
| 2005/0168947 A1 * | 8/2005 | Mok | ..................... | H01L 23/427 361/698 |
| 2009/0159243 A1 * | 6/2009 | Zhao | .................... | F28D 15/046 165/104.26 |
| 2010/0243214 A1 * | 9/2010 | Moon | ................. | F28D 15/0233 165/104.26 |
| 2010/0326632 A1 | 12/2010 | Nagai et al. | | |
| 2017/0314874 A1 * | 11/2017 | Basu | .................... | H01L 21/4871 |

* cited by examiner

FLAT HEAT PIPE WITH RESERVOIR FUNCTION

The present invention relates to heat pipes, and more generally to two-phase heat transfer systems with working fluid. More specifically, it concerns flat heat pipes that are used to transfer the thermal energy produced by electronic equipment such as a processor, power transistor, or any other electronic component that releases thermal energy, or any other source of heat.

In such a heat pipe, the working fluid is vaporized in an area called the evaporator, and the working fluid is condensed in an area called the condenser. The heat pipe in question is formed by a hermetically sealed envelope enclosing a certain amount of working fluid circulating in a closed loop between the evaporator and condenser areas by virtue of the capillary action generated by a capillary structure interposed between the evaporator area and the condenser area.

In particular, the invention concerns flat heat pipes having two opposite faces, namely a "hot" first face receiving heat from the component to be cooled and a "cold" second face intended to transfer thermal energy to a finned radiator or a conventional liquid heat exchanger. This type of heat pipe is also called a "Heat Spreader" by persons skilled in the art. This Heat Spreader type of heat pipe is known for example from U.S. Pat. Nos. 3,613,778, 5,642,776, 7,392,836, or US 20100326632.

We are seeing increased densities of the surface heat fluxes to be transferred at the electronic component, and there is therefore a need to increase the efficiency and optimization of Heat Spreader heat pipes.

Configurations of the prior art do not provide an optimal solution for managing the variations in volume of the liquid as the operating temperature changes.

The volume occupied by the liquid phase increases with the operating temperature and the excess liquid can reduce heat pipe performance, particularly in the heat exchanges at the condenser, which may be partially or completely covered by this excess liquid.

There is therefore a need to improve the management of the excess liquid in order to maintain the heat pipe performance at an optimum level over a wide range of operating temperatures.

To this end, an object of the invention is a flat heat pipe with a two-phase liquid-vapor working fluid, comprising:
- a first plate, intended to receive thermal energy from a heat source,
- a second plate, intended to transfer thermal energy to a cold source, arranged opposite and substantially parallel to the first plate,
- an edge sealingly connecting the first and second plates, to form a closed internal space enclosing the two-phase working fluid,
- a capillary structure, interposed between the first and second plates,
- vaporization channels adjacent to the first plate,
- condensation channels adjacent to the second plate,
- at least one transfer passage placing the evaporation channels in communication with the condensation channels for the transport of vapor,
- at least one collection channel forming a reservoir, in fluid communication with each condensation channel, said collection channel being adjacent to the second plate, such that the collection channel can attract the excess liquid phase by capillarity and store it.

In other words, the collection channel acts as an expansion vessel by capturing the excess liquid, in order to maintain optimum operation of the condensation channels.

In various embodiments of the invention, it is also possible to make use of one or more of the following arrangements:

The vaporization channels and/or the condensation channels may be formed as grooves arranged in the capillary structure or arranged on the inside face of the first and second plates respectively, which represents a simple geometrical configuration that can be obtained by standard manufacturing means: machining, stamping, forming, etc.;

The collection channel is advantageously placed in fluid communication with each condensation channel by means of a narrow/restricted passage; thus obtaining a suction effect by the formation of a meniscus and due to the capillarity phenomenon;

The narrow passage is preferably arranged at the end connected to the reservoir, of each condensation groove; this proves to be an advantageous arrangement compared to the slightly warmer end where the vapor arrives;

The hydraulic diameter of the narrow passage is preferably strictly less than the hydraulic diameter of the condensation channel; thus this encourages the formation of a liquid meniscus at the narrow passage;

The size of the narrow passage is preferably chosen so that a liquid meniscus is formed therein and remains therein, based on the working fluid chosen and regardless of the orientation with respect to the field of gravity, such that the capillary pressure generated by this meniscus compensates for the hydrostatic pressure generated by the field of gravity in any direction;

The mass of working fluid is advantageously selected so that the reservoir is completely filled with vapor phase at the minimum operating temperature of the heat pipe; this thereby optimizes the amount of fluid required for operation over a prescribed range of temperatures;

The envelope formed by the first plate, the second plate, and the edge is preferably made of a ceramic material, said material having a coefficient of thermal expansion that is compatible with the coefficients of thermal expansion of the electronic components; this permits avoiding the risk of mechanical stress;

The capillary structure is preferably made of a ceramic material; the thermal expansion of the capillary structure is thus consistent with that of the envelope, further reducing the risk of mechanical stress.

Figure 6:
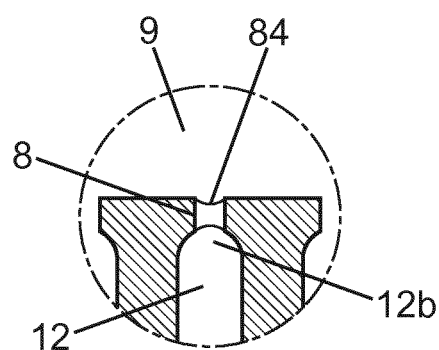
Figure 7:
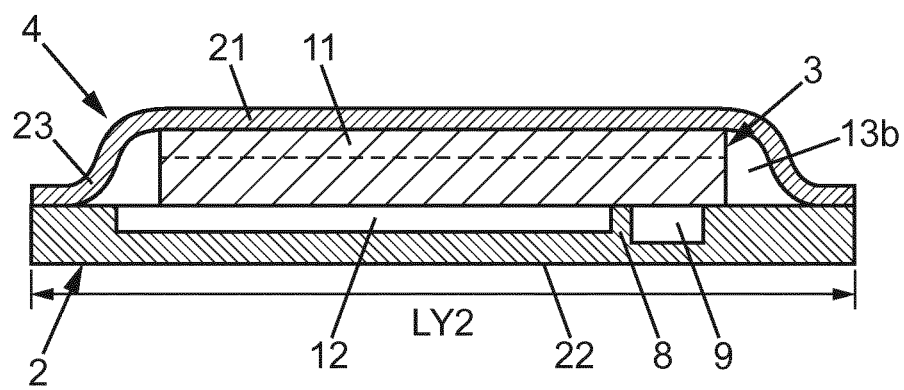
Figure 2:
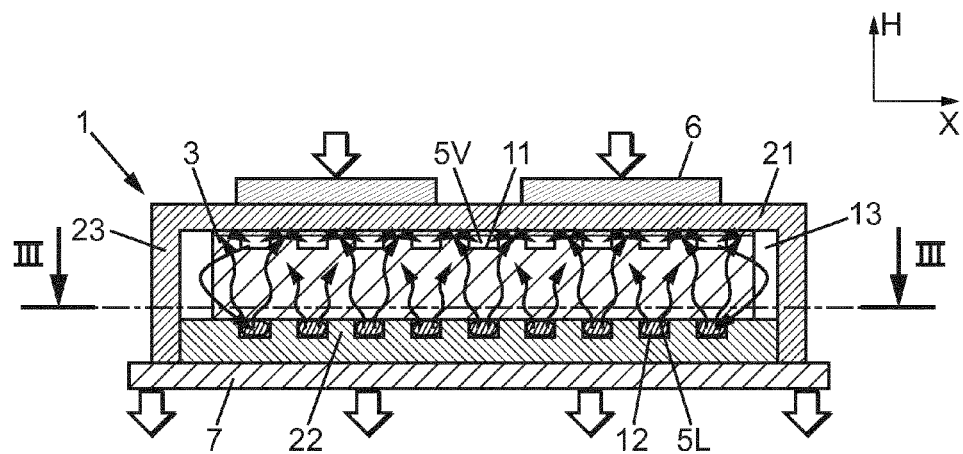
Figure 3:
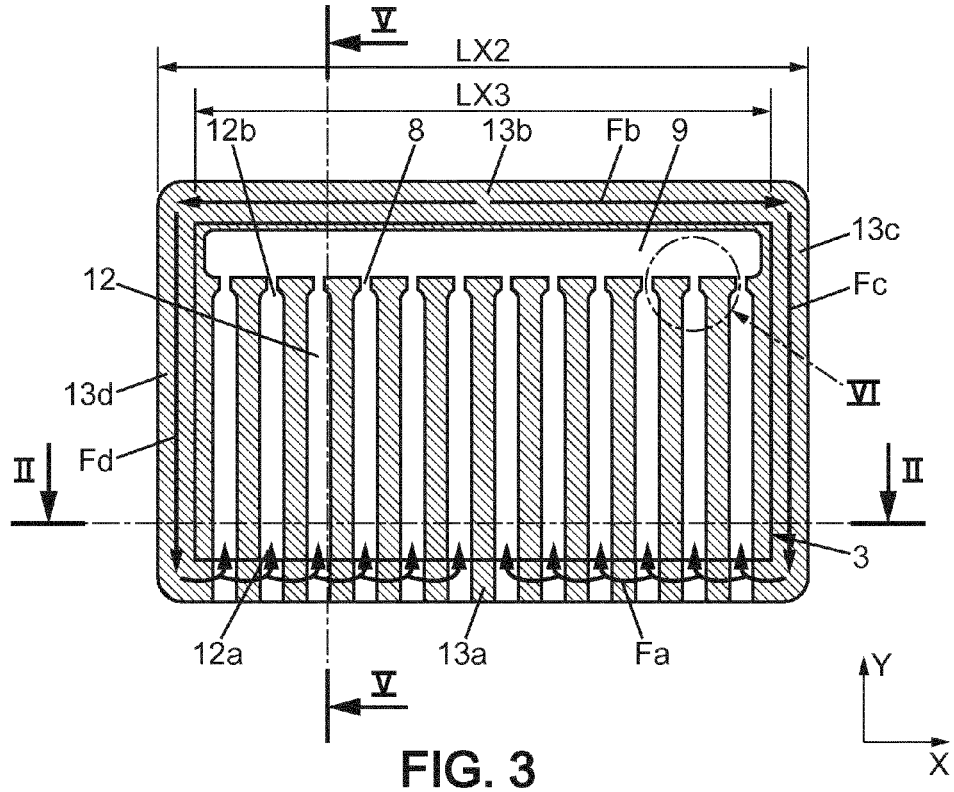
Figure 4:
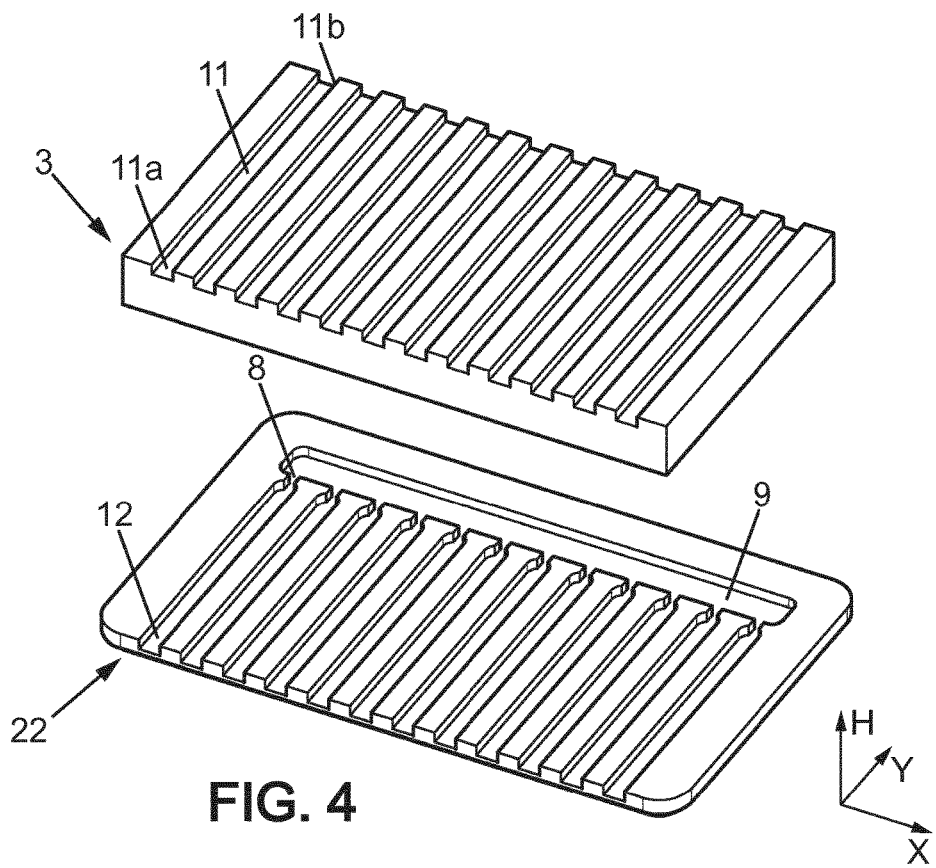
Figure 5:
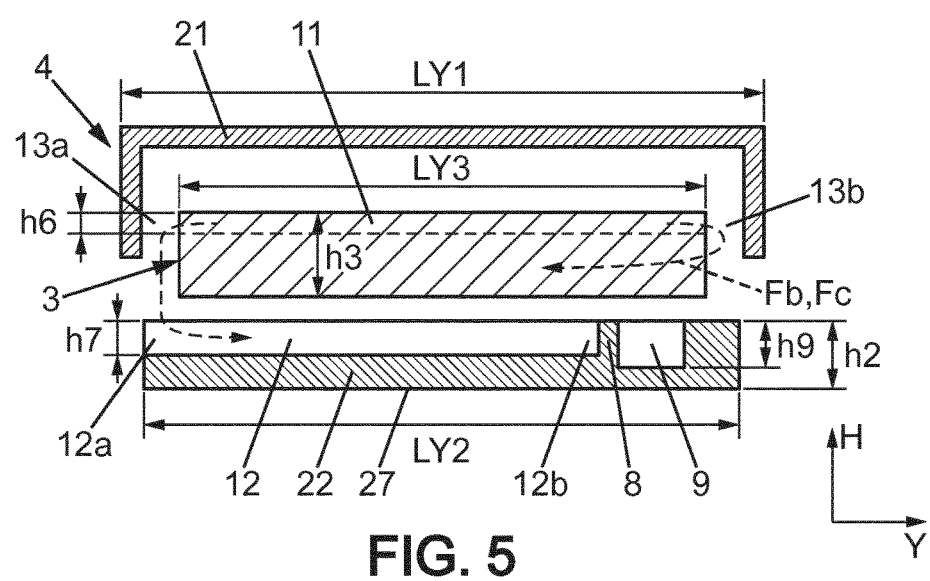

Other features, objects, and advantages of the invention will become apparent from the following description of an embodiment of the invention, given by way of non-limiting example. The invention will also be better understood with reference to the accompanying drawings, in which:

FIG. 1 is a general perspective view of a heat pipe according to the invention in its environment of use, FIG. 2 is a cross-sectional view of a heat pipe according to the invention, along sectional plane II-II visible in FIG. 3, FIG. 3 is a horizontal sectional view of the heat pipe of FIG. 2, along sectional plane III-III visible in FIG. 2, FIG. 4 shows an exploded perspective view of the plate on the condensation side and the capillary structure of the heat pipe of FIG. 2, FIG. 5 shows an exploded side and sectional view of the heat pipe of FIG. 2, along sectional plane V-V visible in FIG. 3, FIG. 6 shows in more detail the restricted passage formed between the collection channel forming a reservoir and a condensation channel, FIG. 7 is a view similar to FIG. 5, and shows a variant embodiment in an assembled configuration.

In the various figures, the same references designate identical or similar elements.

FIG. 1 shows a system comprising a flat heat pipe 1 enabling the transfer of thermal energy produced by dissipative components 6 ("heat source") toward an element 7 able to receive this thermal energy herein referred to as a "cold source" 7. In the example illustrated, a reference plane XY is defined. The physical interface between the dissipative components 6 and the heat pipe 1 is parallel to this reference plane as well as the physical interface between the flat heat pipe 1 and a plate that is part of the cold source 7. The flux of thermal energy is dispersed in all directions X, Y and H by the working fluid flowing inside the heat pipe, to be dissipated at the connection between the condenser plate 22 and the cold source 7, in other words in the transverse direction H perpendicular to the reference plane, but also in directions X and Y of the reference plane. This type of flat heat pipe is also referred to as a Heat Spreader because the surface area for the transfer of thermal energy on the cold source 7 side is larger than the surface area for the intake of thermal energy from the heat source(s) 6.

Inside the flat heat pipe 1 is a two-phase working fluid 5 (meaning it comprises a portion in liquid phase 5L and a portion in vapor phase 5V), intended to draw thermal energy from the heat source 6 and transfer it to the cold source 7.

With reference to FIGS. 2 to 5, the heat pipe 1 comprises a first plate 21 intended to receive thermal energy from the heat source, and a second plate 22 intended to transfer thermal energy to the cold source 7. The second plate 22 is arranged facing the first plate 21 and is parallel to the first plate 21, separated by a distance in direction H.

One will note here that direction H does not necessarily coincide with the vertical in the field of gravity if any, and similarly the reference plane XY does not necessarily coincide with a horizontal plane.

Advantageously, the thickness of the heat pipe 1 along direction H (between the outside faces of the first and second plates 21, 22) is, for example, less than 20 mm, or less than 15 mm, or even less than 10 mm. The heat pipe can thus be easily integrated into a circuit board or an electronic control unit. However, it should be noted that the principle of the invention can be applied with any dimensions.

In addition, an edge 23 connects the first and second plates 21, 22 in a sealed manner; the solid walls of the first and second plates, with said edge, thus form a closed internal space (hermetically sealed enclosure) enclosing the two-phase working fluid 5. Once the enclosure is sealed, there is no exchange of material between the enclosed interior and the exterior; as a result, the amount of working fluid remains constant even if the temperature and pressure conditions vary over time.

A capillary structure 3 is interposed between the first and second plates 21, 22, its function being to draw the liquid phase fluid and create a jump in pressure capable of counterbalancing all head loss in the circuit. The fluid is thus set in motion by this capillary pump in the heat pipe. The capillary structure 3 may be formed by a porous mass (for example based on sintered metal) or by a lattice or steel wool type of structure. The capillary structure 3 may also be obtained from a porous ceramic material, or a porous plastic material. The size of the pores is chosen according to the working fluid in liquid phase and in particular its surface tension (radius of the meniscus which spontaneously forms). The pore size may typically be between 1 micrometer (µm) and 100 micrometers, or even between 1 µm and 20 µm, and preferably between 2 µm and 5 µm. To facilitate reading the figures, the capillary structure 3 has been represented with widely spaced hatching, and without hatching in FIG. 3.

The capillary structure 3 fills with liquid. The heat flux applied by the dissipative components 6 causes the liquid to vaporize at the surface of the capillary material which is thus dried out at that location, thereby attracting the liquid-phase working fluid which sets it in motion in the heat pipe. However, if the operating temperature of the heat pipe begins to rise as a result of external conditions specific to the cooling system, the volume occupied by the liquid phase exceeds the volume that can be accommodated inside the capillary structure. Excess liquid phase 5L is then found outside the capillary structure 3.

Indeed, the density $\rho L$ of the liquid phase decreases when its temperature increases, while conversely, the density $\rho V$ of the vapor phase increases. Consequently, since the total mass of fluid in the heat pipe remains unchanged, the relative liquid volume occupied by the liquid phase 5L inside the closed enclosure of the heat pipe increases as the temperature increases, leading to excess liquid.

Excess liquid in the condensation channels 12 would lead to degraded heat exchanges from the condensation phenomenon and a higher temperature gradient, which would be detrimental.

One will note that the heat pipe 1 can be used in a terrestrial application where there is a field of gravity, but also in a spatial environment where the forces of gravity are much weaker or even negligible.

Due to the thermal energy intake at the first plate 21 (the evaporator side), the liquid-phase working fluid 5L present at that location vaporizes as it absorbs this thermal energy. Advantageously, vaporization channels 11 are provided adjacent to the first plate in order to facilitate channeling away the vapor thus created and to permit continuous entry of other liquid-phase fluid. The vaporization channels 11 may be formed as grooves in the capillary structure, as illustrated, but they may also be formed on the inside face of the first plate 21.

The vapor 5V created on the evaporator side flows through transfer passages 13 in the direction of a condensation area which is located at the second plate 22. At this location, due to the lower temperature of the cold source, the vapor recondenses in liquid form. In the illustrated example, this occurs in condensation channels adjacent to the second plate 22. In the example illustrated, the condensation channels 12 are arranged on the inside face of the second plate. In an alternative embodiment, they could be formed as grooves inside the capillary structure 3.

The liquid-vapor and vapor-liquid phase changes occur at a given temperature determined by the Psat,Tsat equilibrium (saturation conditions), and consequently such a heat pipe with fluid having a liquid-vapor phase change allows on the one hand a very small or even negligible temperature difference between the first plate and the second plate, and on the other hand a more or less perfectly homogeneous temperature of the fluid inside the heat pipe and therefore over the entire surface 27 forming the interface with the cold source 7.

One will note that ideally the vapor does not travel through the capillary structure filled with liquid; the capillary structure filled with liquid thus forms a barrier to the vapor which is called a "capillary seal."

In order to accommodate the excess liquid which may form when the operating temperature increases, in the present invention it is advantageously provided to have a collection channel 9 forming a reservoir, in fluid communication with each condensation channel 12.

The function of this reservoir 9 is to capture any excess liquid, the excess liquid (if any) systematically accumulating naturally in the condenser; the reservoir of the invention attracts and captures the excess liquid as will be detailed below, and this excess liquid thus does not accumulate in the condensation channels 12.

In the example illustrated, the condensation channels 12 extend in direction Y parallel to one another; the reservoir collection channel 9 extends perpendicularly to the condensation channels, in other words in direction X. In the illustrated configuration, the heat pipe has a general parallelepiped shape, although other geometric arrangements are not excluded, for example such as a disc or pancake configuration where the channels are arranged in a star or any other shape allowing a link to be established between heat source and cold source.

Each condensation channel 12 extends between a first end 12a that opens onto the transfer passage 13 and a second end 12b where fluid communication 8 is established with the collection channel forming a reservoir 9.

The connection 8 between the collection channel 9 and each condensation channel is advantageously achieved by means of a narrow passage (restricted passage) 8; more specifically, the hydraulic diameter of the narrow passage is strictly less than the hydraulic diameter of the condensation channel 12.

A liquid meniscus 84 (FIG. 6) is formed at that location, which occupies the volume of the narrow passage 8.

This liquid meniscus 84 generates capillary pressure which compensates for the hydrostatic pressure generated by the field of gravity in the reservoir groove 9 at any angle that direction X may take relative to the vertical.

Depending on the working fluid chosen, the width of the narrow passage 8 may be chosen to be less than three-quarters of the width of the condensation groove, or less than half the width of the condensation groove, or even less than one third.

The reservoir 9 is bordered on its upper face by the capillary structure 3. Thus, the liquid phase can enter or leave the reservoir only through the aforementioned narrow passages 8 and/or by suction by the capillary structure.

Moreover, as the collection channel 9 does not have incoming vapor, its temperature will be slightly lower than the temperature prevailing in the condensation channels. Because of this, there is a slight pressure difference between the condensation channel and the inside of the reservoir 9, drawing the liquid-state fluid into the reservoir.

According to one advantageous arrangement, the hydraulic diameter and the pressure differential that occurs are sufficient to compensate for the effects of the field of gravity, regardless of the orientation of the heat pipe. Moreover, the orientation may vary over time if the heat pipe is on board a means of transport (train, airplane, etc.) or is embedded in a mobile device (laptop, tablet, etc.).

In the example illustrated, the transfer passage 13 serving to convey the vapor is formed by a free space running all along the circumference of the capillary structure, in other words on four sides, namely two lateral cavities 13c, 13d, a rear cavity 13b located close to the reservoir, and a front cavity 13a located opposite the collection channel, this front cavity 13a opening directly into the first ends 12a of each condensation channel.

A first end 11a of each vaporization channel 11 opens into the front cavity 13a, and a second end 11b of each vaporization channel opens into the rear cavity 13b. The flows of vapor through the transfer passages are marked by the labels Fa, Fb, Fc and Fd in FIG. 3.

The amount of working fluid that must be contained in the sealed enclosure of the heat pipe 1 is determined by the minimum operating temperature of the heat pipe, referred to as T_min_op.

Thus, ideally one chooses the mass of fluid 5 for which the liquid phase 5L occupies the entire volume of the capillary structure but no more; In other words, the mass of fluid 5 is chosen such that the reservoir 9 is completely filled with vapor phase 5V at the minimum operating temperature T_min_op of the heat pipe.

When the operating temperature of the heat pipe increases from T_min_op, excess liquid is produced and the reservoir 9 then fills.

If the operating temperature of the heat pipe is less than T_min_op, the capillary structure is then not completely filled with liquid and the reservoir is being completely filled with vapor. In this case, the heat transfer performance of the heat pipe may be sub-optimal, but the heat pipe can operate in degraded mode (oscillations in the fluid flow rate and/or operating temperature, or even a re-increase of the latter until T_min_op is once again exceeded).

The volume of the reservoir 9 can be determined so as to allow an amount of excess liquid 5L which corresponds to a maximum operating temperature T_max_op.

The first and second plates 21, 22 and the edge 23 may be formed of metal material (Ni, Cu, stainless steel, etc.) or of ceramic material (Al2O3, AlSiC, AlN, etc), or of plastic material. It should be noted that the edge 23 may form a separate part or may be obtained as a single part with one of the plates, for example the first plate as illustrated in FIG. 5, the part denoted 4 including the first plate and the edge. The edge is sealed by brazing, laser welding, structural bonding, or the like.

In one embodiment, the second plate, the condensation grooves, and the collection channel together form a base part denoted 2.

The edge could also serve as a coupling area in the reference plane XY, with the rims of each plate joining together, the first plate having an offset dished edge as shown in FIG. 7.

The working fluid 5 used is preferably a so-called "low pressure" fluid which limits mechanical stresses on the heat pipe envelope, for example water, methanol, acetone, ethanol, or any refrigerant fluid.

In the example illustrated, the capillary structure 3 has a general parallelepiped shape with a width LX3, a length LY3 and a height h3. The first plate 21 has a length LY1 substantially corresponding to the sum of LY3 plus the width of the front and rear passages 12a, 12b plus the thickness of the edge. The second plate 22 has a width LX2, a length LY2, and a height h2.

The height h7 of the condensation grooves may be identical to the height h9 of the collection channel forming a reservoir, although the latter may be greater (h9>h7); one may also choose h9<h7, depending on the needs and constraints of the intended application.

The height of the vaporization grooves is denoted h6 and may be close to height h7.

It should be noted that the cross-section of the grooves (vaporization side and/or condensation side) may be square as shown, but could also be rectangular, triangular, semicircular, etc.

For assembly of the heat pipe itself or of the heat pipe in its mechanical environment, holes (possibly through-holes, possibly threaded) may be provided in the first and second plates and in the capillary structure.

One will note that the reservoir could store frozen liquid under specific temperature conditions; the reservoir may also store non-condensable gases.

The connection to the cold source is either established directly by assembly, or may be done by the addition of fins in the case of convective exchanges with an external fluid as cold source.

One will note that without departing from the scope of the invention, the first and second plates 21, 22 may possibly not be parallel to one another.

Advantageously, the system is completely passive, it contains no active components, it requires no maintenance, and it preferably operates in any orientation in space.

For the initial filling of the heat pipe, a filling opening and a hose are provided (not shown in the figures), the filling opening being closed by a valve or cap or permanently sealed after introduction of the prescribed amount of working fluid.

One will note that the cavity forming the reservoir may be of any shape; apart from the configuration of a collection channel as shown in the figures, it would also be possible to have a cylindrical cavity with the grooves extending in a star shape and connected thereto.

Similarly, one will note that the cavity forming a reservoir could be formed in several parts, either isolated from each other or in communication with each other by restricted passages which limits the total apparent hydrostatic height.

The invention claimed is:

1. A flat heat pipe with a two-phase liquid-vapor working fluid, comprising:
    a first plate configured to receive thermal energy from a heat source,
    a second plate configured to transfer thermal energy to a cold source, arranged opposite and substantially parallel to the first plate,
    an edge sealingly connecting the first and second plates, forming a closed internal space enclosing the two-phase liquid-vapor working fluid,
    a capillary structure interposed between the first and second plates,
    vaporization channels adjacent to the first plate,
    condensation channels adjacent to the second plate,
    at least one transfer passage placing the vaporization channels in communication with the condensation channels for transporting vapor,
    at least one collection channel forming a reservoir, in fluid communication with each condensation channel, said collection channel being adjacent to the second plate; such that the collection channel is arranged to attract and store excess liquid phase, and
    narrow passages that place the collection channel in fluid communication with the condensation channels, respectively, wherein each narrow passage has a cross section smaller than a general cross section of the respective condensation channel with which the narrow passage is in fluid communication.

2. The heat pipe according to claim 1, wherein:
    the vaporization channels are formed by grooves arranged in the capillary structure or arranged on an inside face of the first plate; and/or
    the condensation channels are formed by grooves arranged in the capillary structure or arranged on an inside face of the second plate.

3. The heat pipe according to claim 1, wherein each narrow passage has a hydraulic diameter strictly less than a hydraulic diameter of the respective condensation channel with which the narrow passage is in fluid communication.

4. The heat pipe according to claim 1, wherein each condensation channel has an end connected to the reservoir, and the narrow passages are arranged at the ends of the condensation channels, respectively.

5. The heat pipe according to claim 1, wherein each narrow passage is sized so that a liquid meniscus is formed therein and remains therein, based on the working fluid chosen and regardless of an orientation with respect to the field of gravity, such that the meniscus generates a capillary pressure that compensates for the hydrostatic pressure generated by the field of gravity in any direction.

6. The heat pipe according to claim 1, wherein the two-phase liquid-vapor working fluid is selected so that the reservoir is completely filled with vapor phase at a minimum operating temperature of the heat pipe.

7. The heat pipe according to claim 1, wherein the first plate, the second plate, and the edge are made of ceramic material.

8. The heat pipe according to claim 1, wherein the capillary structure is made of ceramic material.

9. A flat heat pipe with a two-phase liquid-vapor working fluid, comprising:
    a first plate configured to receive thermal energy from a heat source,
    a second plate configured to transfer thermal energy to a cold source, arranged opposite and substantially parallel to the first plate,
    an edge sealingly connecting the first and second plates, forming a closed internal space enclosing the two-phase liquid-vapor working fluid,
    a capillary structure interposed between the first and second plates,
    vaporization channels adjacent to the first plate,
    condensation channels adjacent to the second plate,
    at least one transfer passage placing the vaporization channels in communication with the condensation channels for transporting vapor, and
    at least one collection channel forming a reservoir, in fluid communication with each condensation channel, said collection channel being adjacent to the second plate; such that the collection channel is arranged to attract and store excess liquid phase, wherein the two-phase liquid-vapor working fluid is selected so that the reservoir is completely filled with vapor phase at a minimum operating temperature of the heat pipe.

10. A flat heat pipe with a two-phase liquid-vapor working fluid, comprising:
    a first plate configured to receive thermal energy from a heat source,
    a second plate configured to transfer thermal energy to a cold source, arranged opposite and substantially parallel to the first plate,
    an edge sealingly connecting the first and second plates, forming a closed internal space enclosing the two-phase liquid-vapor working fluid,
    a capillary structure interposed between the first and second plates,
    vaporization channels adjacent to the first plate,
    condensation channels adjacent to the second plate,
    at least one transfer passage placing the vaporization channels in communication with the condensation channels for transporting vapor, and
    at least one collection channel forming a reservoir, in fluid communication with each condensation channel, said collection channel being adjacent to the second plate;

such that the collection channel is arranged to attract and store excess liquid phase, wherein the collection channel is only in fluid communication with the condensation channels, and the collection channel is deprived of any other fluid communication with the vaporization channels.

11. The heat pipe according to claim 10, wherein:
the vaporization channels are formed by grooves arranged in the capillary structure or arranged on an inside face of the first plate; and/or
the condensation channels are formed by grooves arranged in the capillary structure or arranged on an inside face of the second plate.

12. The heat pipe according to claim 10, further comprising narrow passages that place the collection channel in fluid communication with the condensation channels, respectively, wherein each narrow passage has a hydraulic diameter that is strictly less than a hydraulic diameter of the condensation channel to which the narrow passage is connected.

13. The heat pipe according to claim 10, wherein the first plate, the second plate, and the edge are made of ceramic material.

14. The heat pipe according to claim 10, wherein the capillary structure is made of ceramic material.

* * * * *